United States Patent
Thomas et al.

[19]

[11] Patent Number: 5,986,462
[45] Date of Patent: *Nov. 16, 1999

[54] AUXILIARY POWER UNIT TESTER

[75] Inventors: Daniel T. Thomas; Burton M. Kuck, both of Escondido, Calif.

[73] Assignee: Applied Data Technology, Inc., San Diego, Calif.

[*] Notice: This patent is subject to a terminal disclaimer.

[21] Appl. No.: 08/829,205

[22] Filed: Mar. 31, 1997

Related U.S. Application Data

[63] Continuation-in-part of application No. 08/337,044, Nov. 10, 1994, Pat. No. 5,617,039.

[51] Int. Cl.$^6$ .............................. G06F 15/20; G01R 31/00
[52] U.S. Cl. ...................... 324/771; 324/73.1; 324/158.1
[58] Field of Search ................................. 324/158.1, 73.1, 324/537; 60/39.07, 39.29; 415/48, 155, 182.1; 244/194, 195; 701/35

[56] References Cited

U.S. PATENT DOCUMENTS

| | | | |
|---|---|---|---|
| 3,764,814 | 10/1973 | Griffith | 60/39.161 |
| 5,033,010 | 7/1991 | Lawrence et al. | 701/35 |
| 5,079,707 | 1/1992 | Bird et al. | 701/35 |
| 5,146,160 | 9/1992 | Pinkston | 324/537 |
| 5,235,803 | 8/1993 | Rodgers | 60/39.07 |

*Primary Examiner*—Vinh P. Nguyen
*Attorney, Agent, or Firm*—John R. Ross; John R. Ross, III

[57] ABSTRACT

A testing device to test and troubleshoot APUs that is designed to be small, rugged, light weight, and easily adaptable to many different APU applications. Using a special multi-wire cable system, test and monitor circuits are imposed between the APU control panel and the ECU and also between the ECU and the LRUs. LRU electrical circuits are subjected to short electrical pulses and the resulting current flow is monitored. Defective LRUs are detected by a very low or zero current measurement indicating an open circuit or by an excess current flow indicating a short circuit. The testing device does not include standard monitoring equipment such as voltmeters and oscilloscopes which would require calibration. Instead, the APU Tester's signal selector equipment routes a selected APU signal to the APU Tester's front panel test jacks for easy monitoring of circuit resistance and signal characteristics using standard external monitoring equipment which can be separately calibrated. The testing device provides signal buffer circuits and signal latch circuits to furnish a record indicating if signals are transmitted between the APU's LRUs. The testing device uses APU power (from either the APU battery or the APU generator) as its sole power source allowing the APU Tester to be used even in those situations where standard power is unavailable.

7 Claims, 18 Drawing Sheets

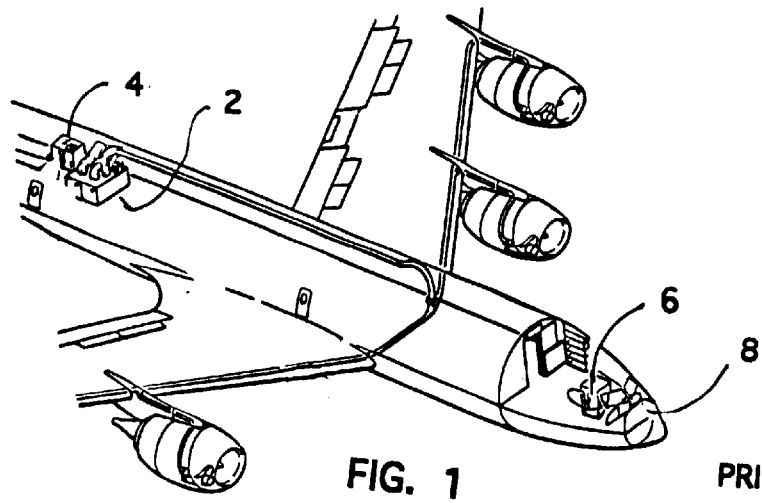
FIG. 1 PRIOR ART
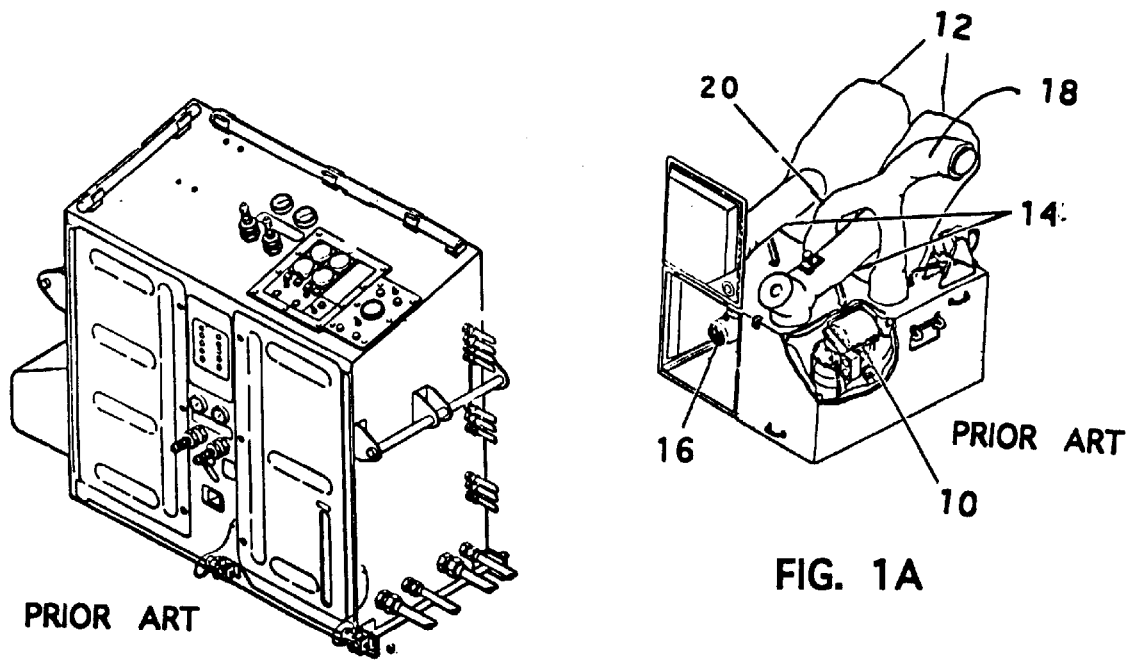
FIG. 1A PRIOR ART
FIG. 1B PRIOR ART

AUXILIARY POWER UNIT TESTER

This is a Continuation-In-Part application of Ser. No. 08/337,044 filed Nov. 10, 1994 to issue as U.S. Pat. No. 5,617,039 on Apr. 1, 1997. This invention relates to portable test units for auxiliary power units (APU) commonly used on commercial and military vehicles.

BACKGROUND

APUs are used on a vast number of commercial and military vehicles. Applications include, but are not limited to, aircraft, tanks and other tracked vehicles. The functions of an APU will vary from vehicle to vehicle, but in general most are used as a means to provide electrical power to operate the vehicle's electronic systems at a significantly lower fuel consumption rate than is possible when running the vehicle's main engines. Other APU functions can include charging the vehicle's batteries, operation of the vehicle's hydraulic system, and providing the compressed air sometimes needed to start the vehicle's main engines.

A simplified block diagram of a typical APU system is shown in FIG. 7. An APU generally consists of one or more operator control panels 110, a gas turbine or diesel engine 111, a generator 112, an electronic control unit (ECU) 113 (also called electronic sequencing control unit (ECSU)), and numerous servos, valves, relays, and sensors 114 to control engine operation. Any component of the APU that is individually replaceable in a maintenance operation is commonly referred to as a line replaceable unit (LRU).

Aircraft Applications

There exists more than 60,000 aircraft in the world that have APUS. These APUs are typically reliable but like all equipment they are subject to failure. In most cases the aircraft cannot take off if the APU is not functioning properly. To determine the cause of a failure of an APU, maintenance personnel use standard electronic test equipment such as voltmeters, ohmmeters, and oscilloscopes.

The T40LC-2 APU

A typical APU is the Turbomach T40LC-2 (hereinafter, T40LC-2 APU) provided for the United States Air Force KC-135R aircraft and other aircraft. There are approximately 586 of these units currently installed in operating aircraft. The value of these aircraft is as much as $10 million each and the total value of all of these aircraft is over $8 billion. If the APUs is these very valuable aircraft are not working the aircraft does not take off.

The T40LC-2 APU is supplied by Sundstrand Turbomach Corporation and supplies a very high volume of low pressure compressed air for onboard start of several types of jet aircraft. In addition, it provides auxiliary electric power for the aircraft. FIG. 1 shows the location of principal components of the T40LC-2 APU on an aircraft. The principal components are the power unit 2, control panel 4, crew entry start switch 6, and the pilot start control panel 8. Power unit 2 is shown in greater detail in FIG. 1A and control panel 4, is shown in greater detail in FIG. 1B. Elements of the power unit include two turbine engines as shown at 10, two inlet ducts 12, two cooling ducts 14, one generator 16, and one low pressure compressed air exit duct 18 supplied by both engines through Y-duct 20.

The two gas turbine engines, each drive a low pressure high volume compressor supplying input air for starting the aircraft main drive engines. Either of the APUs engines can be arranged to drive a generator which produces 400 Hz AC power for distribution through the aircraft's electrical system. The gas turbine engines use JP-4 fuel supplied by the aircraft's wing tank. The operation of the turbine engines is controlled by the electronic control unit 13 in FIG. 7. FIG. 7 also shows normal APU connections. The ECU provides the control signals necessary to operate the engines' servos, valves, and relays. The ECU also monitors engine operation using signals from several sensors mounted in the engine.

The T40LC-2 APU costs about $150,000. A special test device has been developed for the Air Force for testing this APU. It is known as the TTU469/E unit and currently sells for about $82,750. It weighs in excess of 75 pounds. It is difficult to maintain in good working condition. It comprises a number of built-in test instruments, each of which must be calibrated individually.

Tank Applications

The ABRAMS tank is used by the United States Army and Marines as well as numerous foreign governments. This tank has been outfitted with an external APU (EAPU) that is mounted to the rear of the gun turret. Currently there does not exist any specific test equipment for the EAPU. To determine the cause of a failure of an EAPU, maintenance personnel use standard electronic test equipment such as voltmeters, ohmmeters, and oscilloscopes.

The ABRAMS Tank EAPU

The ABRAMS Tank EAPU is manufactured by Tiernay Corporation and supplies 78 to 110 amperes at 28 volts to operate the vehicle's electronics systems and charge the vehicle's batteries without main engine operation. FIG. 12 shows the location of principal components of the ABRAMS Tank EAPU. The control panel 60 and the engine assembly 61 can easily be seen.

The 4-cycle diesel engine drives a 28 V direct current (DC) generator supplying the auxiliary power to the vehicle's electrical system. The diesel engine uses regular diesel fuel supplied from the EAPU's own 3.1 gallon fuel tank. The operation of the diesel engine is controlled by the electronic control unit 113 in FIG. 7. FIG. 7 also shows normal EAPU connections. The ECU provides the control signals necessary to operate the engine's servos, valves, and relays. The ECU also monitors engine operation using signals from several sensors mounted in the engine.

The ABRAMS Tank EAPU costs about $25,000. There currently does not exist a dedicated device for testing this EAPU in a fast an efficient manner. What is needed is a reliable, accurate, and easy to use device for testing APUs.

SUMMARY OF THE INVENTION

The invention provides a simple device and method to test and troubleshoot APUs and is designed to be small, rugged, light weight, and easily adaptable to many different APU applications. Using a special multi-wire cable system, test and monitor circuits are imposed between the APU control panel and the ECU and also between the ECU and the LRUs. LRU electrical circuits are subjected to short electrical pulses and the resulting current flow is monitored. Defective LRUs are detected by a very low or zero current measurement indicating an open circuit or by an excess current flow indicating a short circuit. This invention does not include standard monitoring equipment such as voltmeters and oscilloscopes which would require calibration. Instead the APU Tester's signal selector equipment routes a selected APU signal to the APU Tester's front panel test jacks for easy monitoring of circuit resistance and signal characteristics using standard external monitoring equipment which can be separately calibrated. The invention provides signal buffer circuits and signal latch circuits to furnish a record indicating if signals are transmitted between the APU's LRUs. The invention uses APU power (from either the APU battery or the APU generator) as its sole power source allowing the APU Tester to be used even in those situations where standard power is unavailable.

BRIEF DESCRIPTION OF THE DRAWINGS

FIG. 1 is a partially cutaway drawing of an aircraft showing locations of APU equipment.

FIGS. 1A and 1B are drawings of APU equipment.

DETAILED DESCRIPTION OF PREFERRED EMBODIMENTS

Elements to be Tested

In this preferred embodiment, we provide a device and method for testing the elements of the T40LC-2 APU. Specifically, we test the following elements of the T40LC-2 APU, all of which are LRU's:

Starter motor hydraulic valve

Start fuel solenoid valve and exciter circuit

Inlet guide vane (IGV)actuator

Fuel control servo

Surge (bypass) control valve

Main fuel solenoid valve

Fuel manifold purge solenoid valve

Battery

The APU Tester

Figure 3:
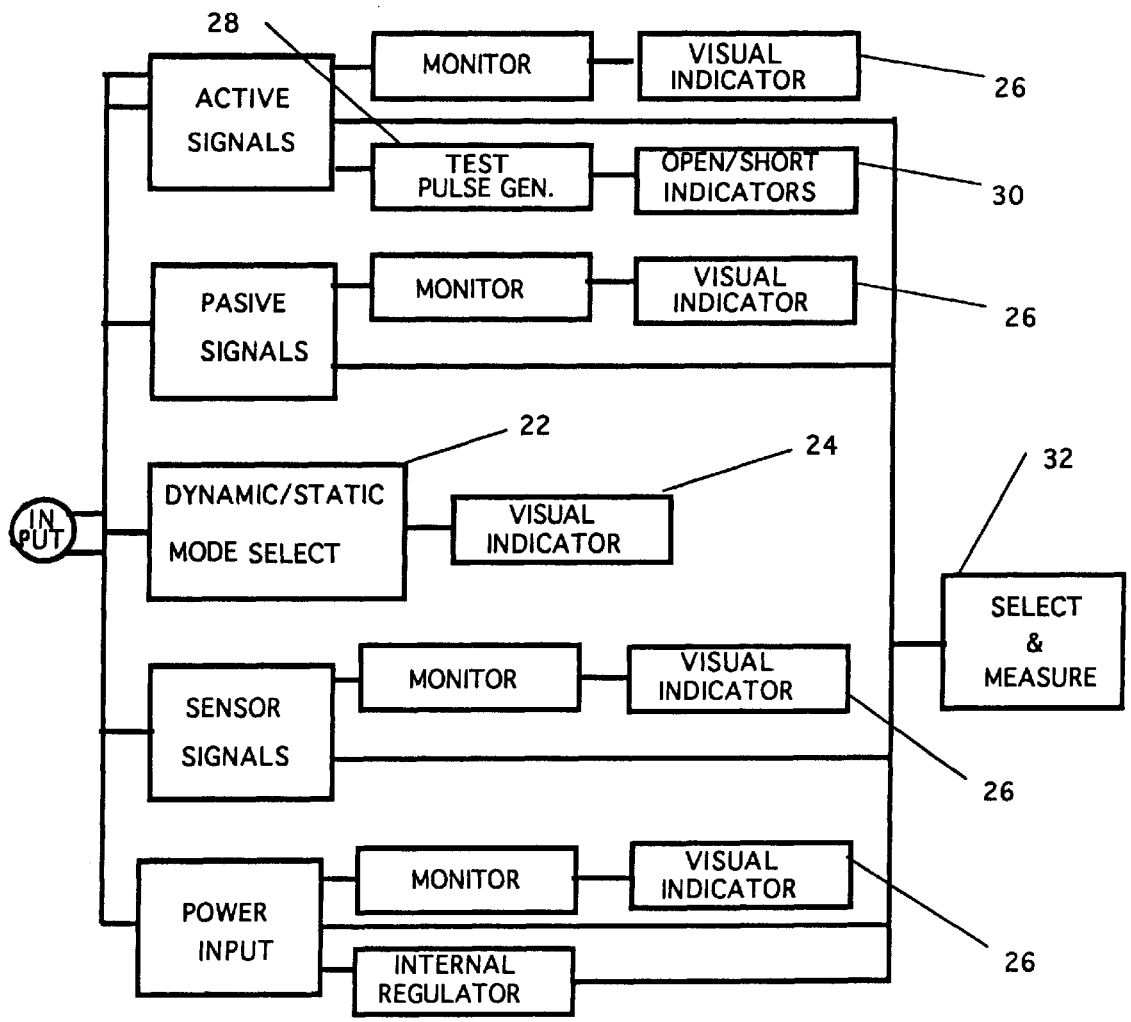
FIG. 3 is a block diagram showing some of the functions of the above embodiment.

Our device (hereinafter, the APU Tester) can be described by reference to FIGS. 3, 4A through 4E, 5, and 6A and B. FIG. 3 is a block diagram showing the principal elements of the APU tester. These elements include a mode select switch 22 with visual indication 24 of the selected mode, visual indicators 26 for monitoring all APU signals (active, passive, sensor, and power), a voltage test pulse generator 28 to indicate on indicators 30 the active signals for open or short circuits and a select switch 32 to select any APU signal for measurement using external test equipment.

The APU Tester provides the means to operationally monitor and test the electrical signals between the ESCU and each LRU. It permits a ready means of performing the initial fault isolation of any LRU of a failed T40LC-2 APU. While the APU Tester performs its testing of the APU by examining and exercising only electrical signals, this method will uncover problems of both electrical and electromechanical nature. This is due to the fact that the electrical signals monitored are often the outputs of sensors that are reporting the operating conditions of mechanical parts. In addition, the relay and servo signals that are exercised will indicate both electrical and electromechanical failures. This level of testing is adequate since the vast majority of APU failures are electrical or electromechanical in nature. When a defect in an LRU is identified, the defect can be repaired if the problem is obvious; or the LRU can be quickly replaced and repaired later; or, if repair is not appropriate, disposed of. Problems with the ESCU can also be identified and when this is the case, the ESCU can also be quickly replaced to minimize down time of the aircraft.

Figure 4A:
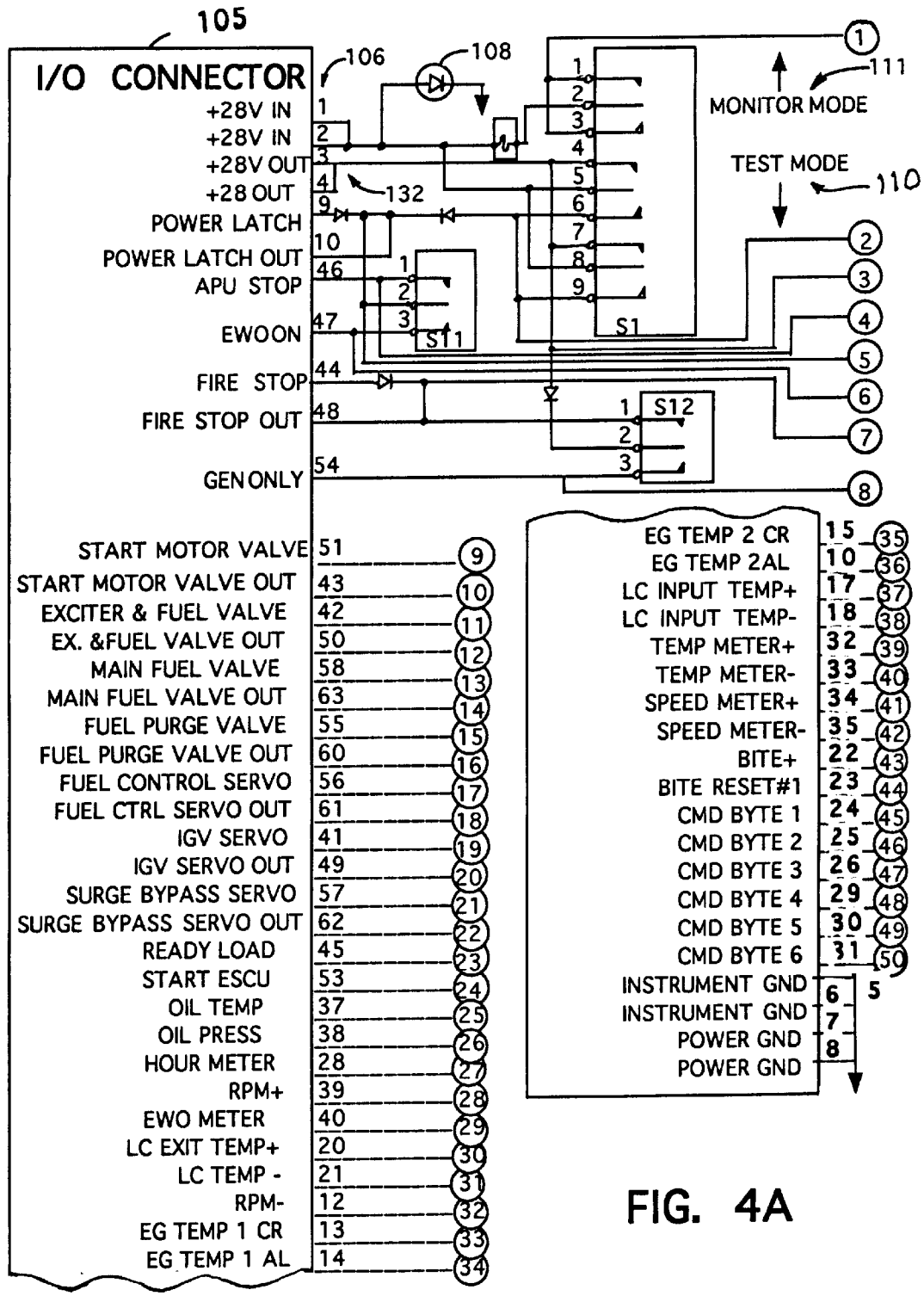
FIGS. 4A through 4E are circuit drawings of the above embodiment.
Figure 6A:
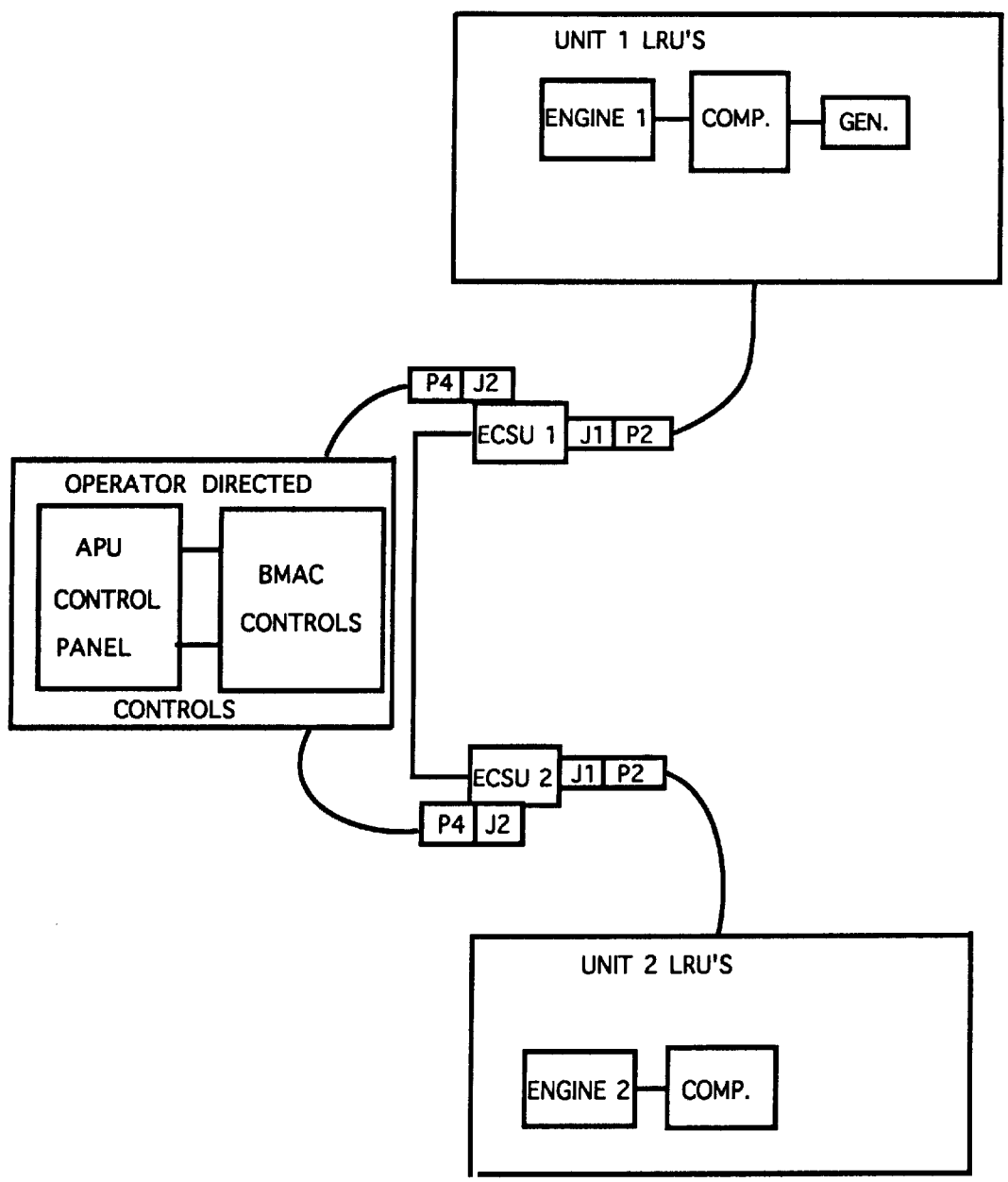
FIG. 6A shows normal connections between APU equipment.
Figure 6B:
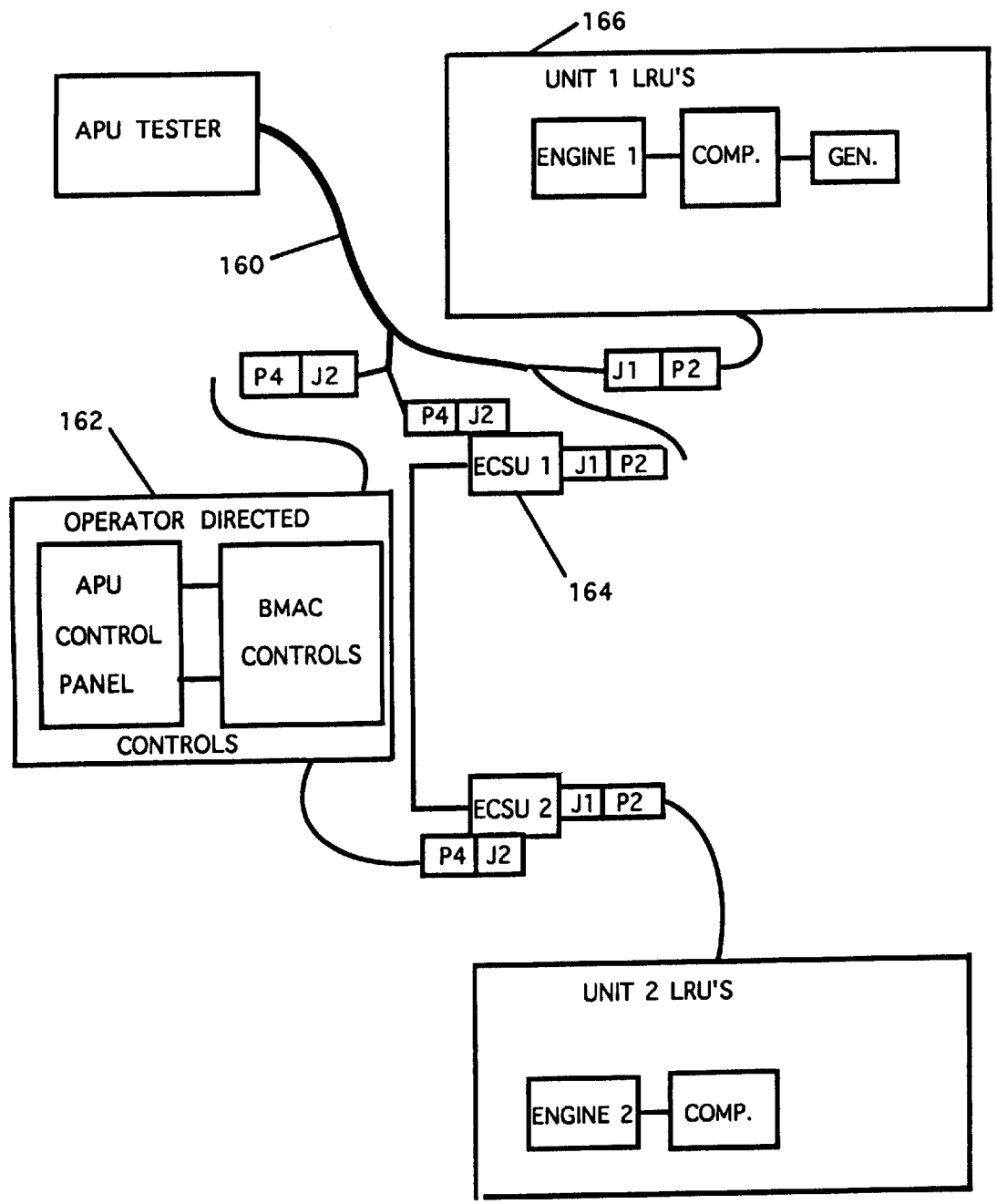
FIG. 6B shows the wiring setup to utilize the above embodiment to test the APU equipment.
Figure 7:
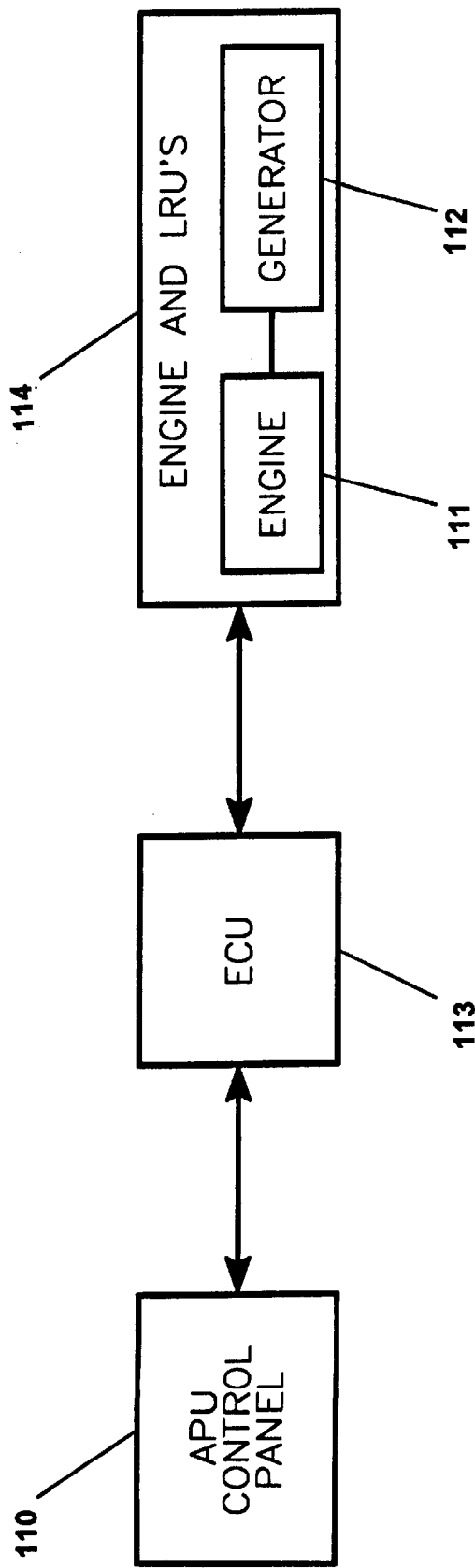
FIG. 7 is a simplified block diagram of a typical APU system.

FIGS. 4A, B, C, D, and E are the circuit diagrams of the APU Tester. The APU Tester is shown in FIG. 6B connected to an APU to test portions of the unit. Cable 160 permits the APU Tester to be electrically inserted in between (1) operator directed controls 162 and one of the ESCU's 164 and (2) the ESCU and the corresponding group of LRU's 166. APU Tester cable connectors are equivalent to the APU cable connectors so the connections can be made very quickly. Each of APU Tester cable connectors J1, J2, P2, and P4 is a 41-pin connector. J1 and J2 provide connections to the following signals: Fuel Purge Valve, Exciter & Fuel Valve, Main Fuel Valve, Fuel Control Servo, IGV Servo, Surge Bypass Servo, Oil Pressure, Oil Temperature, Hour Meter, EWO Hour Meter, EG Temp 1, EG Temp 2, Engine Speed, LC Input Temp, and LC Exit Temp.

APU Tester cable connector J2 and P4 pick up the following signals from the ESCU: Start Motor Hydraulic Valve, Start ESCU, Fire Stop, APU Stop, Generator Only, Ready Load, EWO on, Power Latch, Temp Meter, Speed Meter, BITE, BITE Reset 1, CMD BITE 1 through 6, +28VDC, and Ground.

Figure 2:
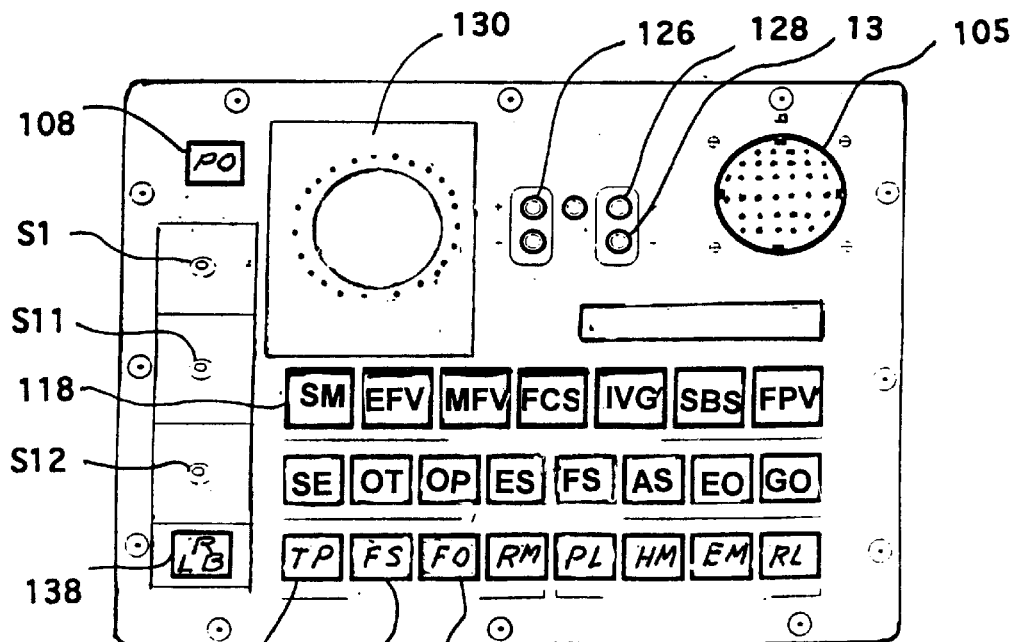
FIG. 2 is a drawing of the front panel of an embodiment of the present invention.

Cable 160 is connected to the APU Tester via a 66 pin I/O connector 105 as shown in FIG. 2. The signals and their corresponding pin numbers are shown in FIG. 4A.

Figure 4B:
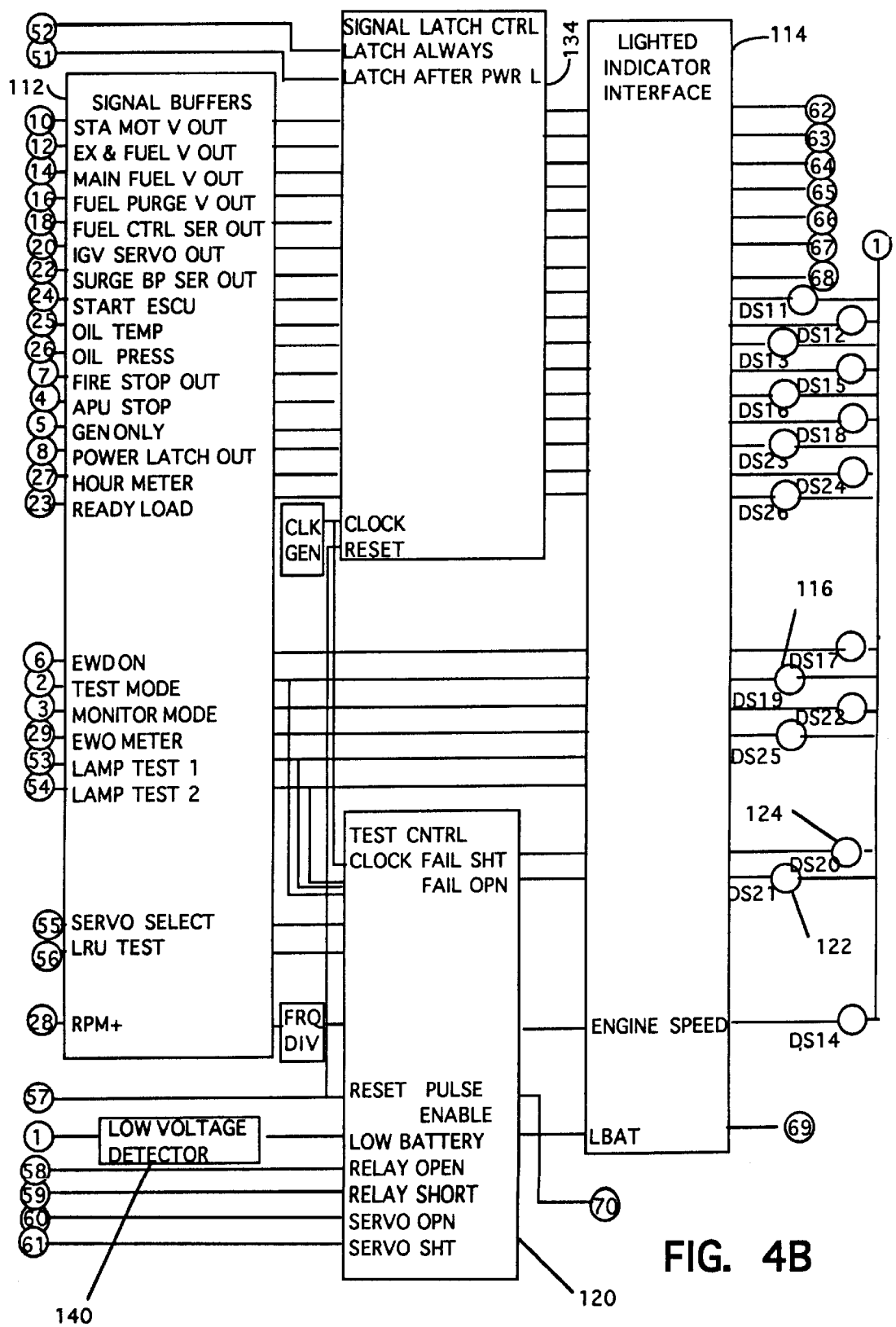

Electrical circuits of the APU Tester are shown in FIGS. 4A, B, C, D, and E. The control panel of the APU Tester is shown in FIG. 2. The principal electronic components of the APU Tester are:

(1) Test control circuit 120 as shown in FIG. 4B controls the pulse testing function. This circuit is supplied by Altera Corp. of San Jose Calif. as Part No. EP910DC-40.

(2) Signal latch control circuit 134 as shown in FIG. 4B which is supplied by Altera as Part No. EP910DC-40.

(3) Light indicator interface 114, supplied by Texas Instruments as Part No. ULN2003AN.

(4) 28 Volt pulse generator 102 Which utilizes a Darlington transistor supplied by Texas Instruments as P/N TIP115.

Figure 4C:
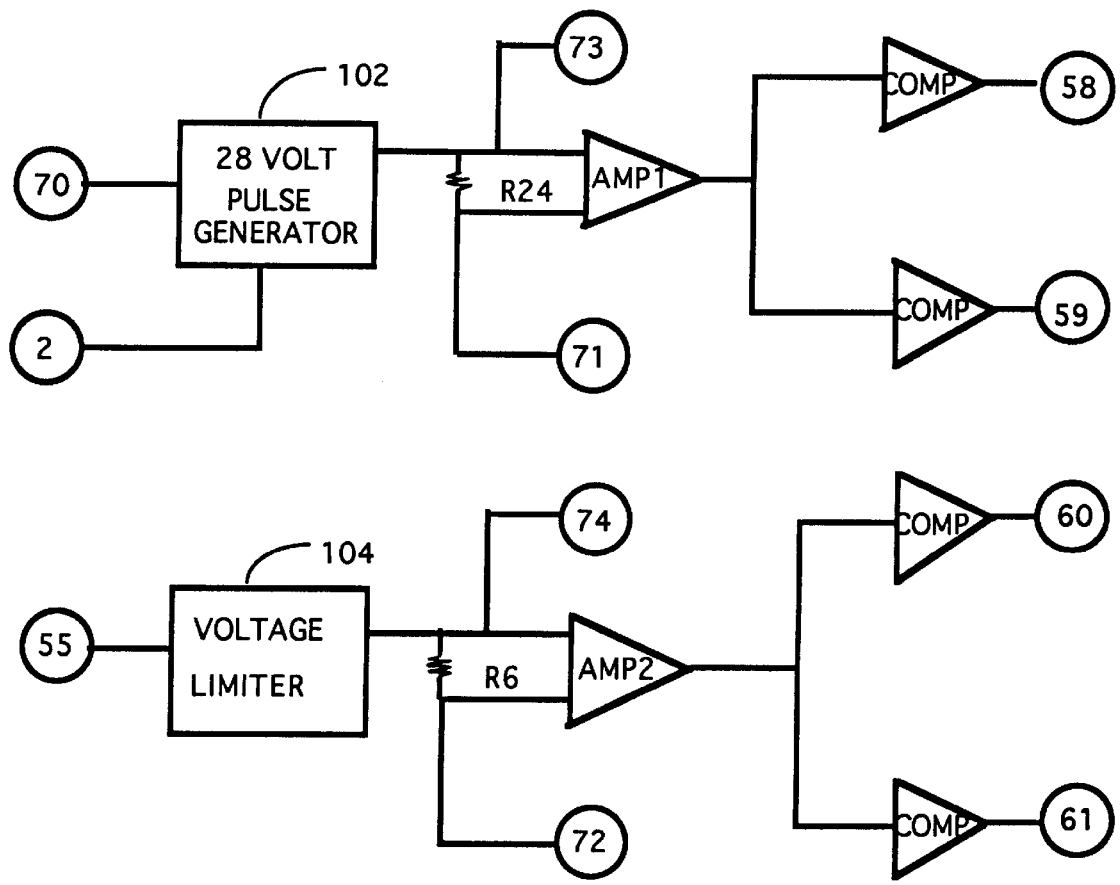
Figure 4D:
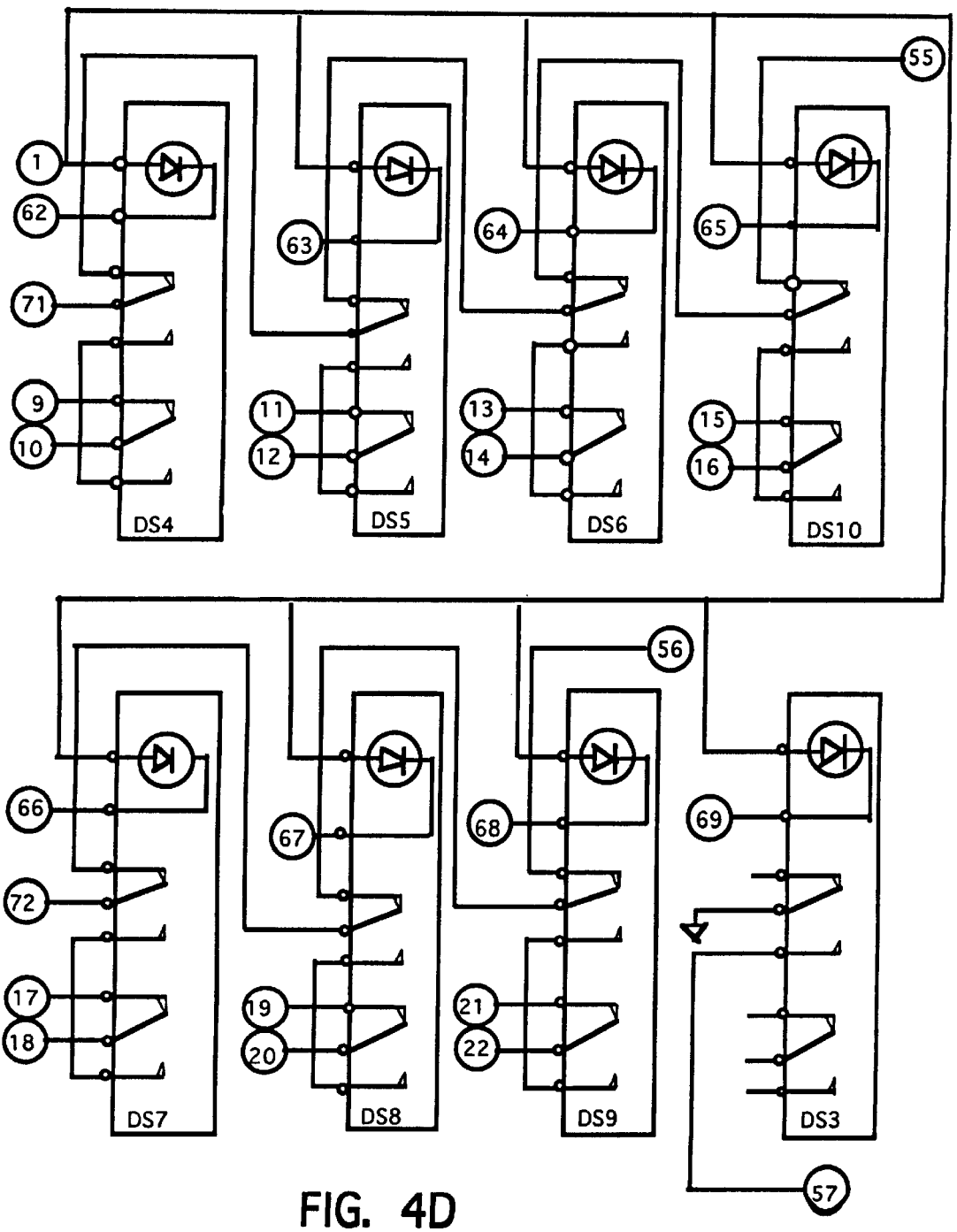
Figure 4E:
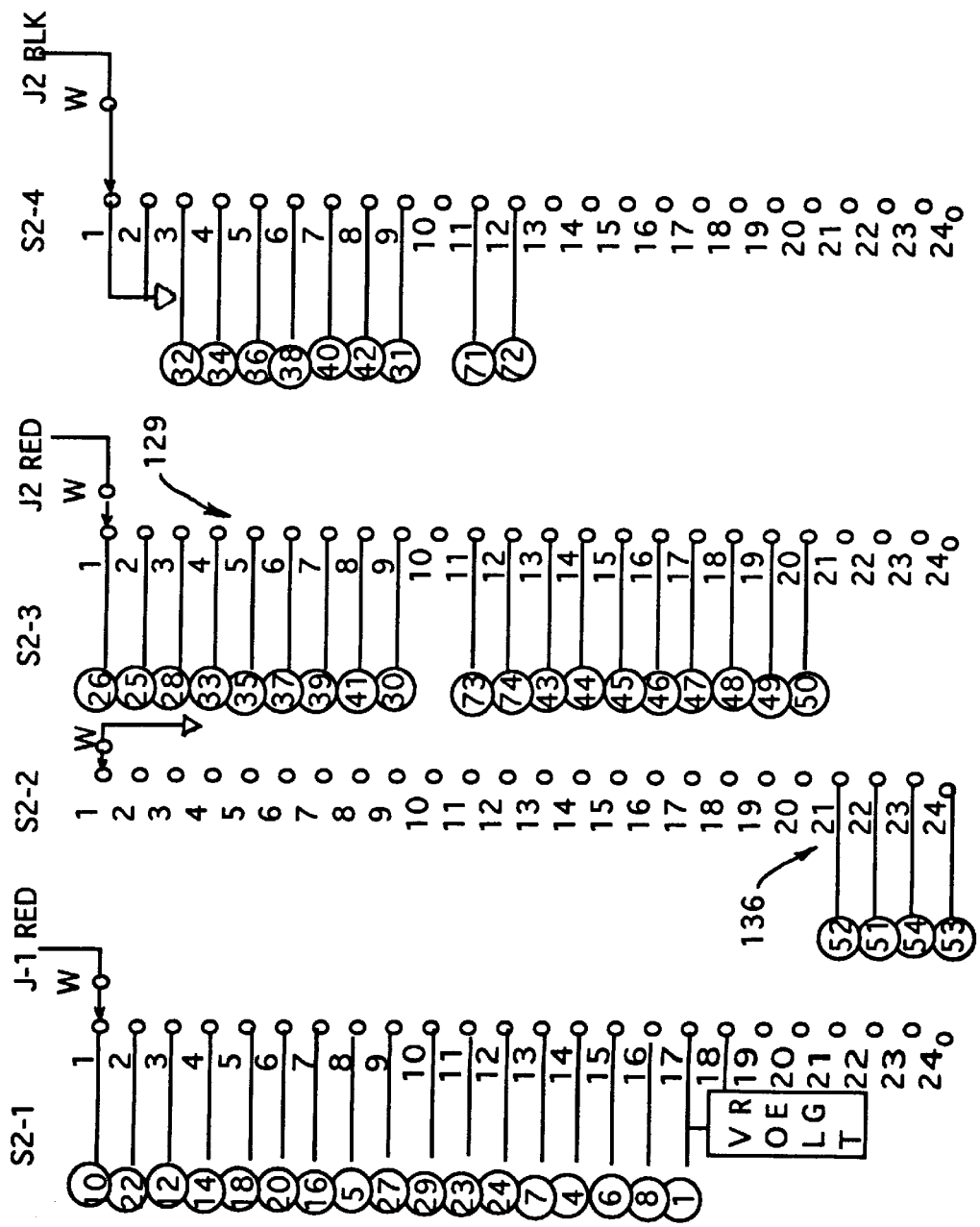

(5) A four-deck, 24 position signal selector switch 130 shown on FIG. 2 and indicated as switch S2 on FIG. 4E.

(6) Test jacks 126, 128, and 130 permit oscilloscope and other monitoring of APU signals.

FIG. 4A shows the interface circuitry for the power, ground, fire stop, power latch, APU stop, EWO ON, and GEN ONLY signals; and the interconnects between the three control switches S1, S11, and S12. FIG. 4B depicts the programmable logic, the lighted indicators interface and the wiring for the lighted indicators. FIG. 4C shows the current measuring circuits. FIGS. 4D shows the wiring for the LRU test buttons and the reset button. FIG. 4E shows the wiring for the test selector switch.

Figure 5:
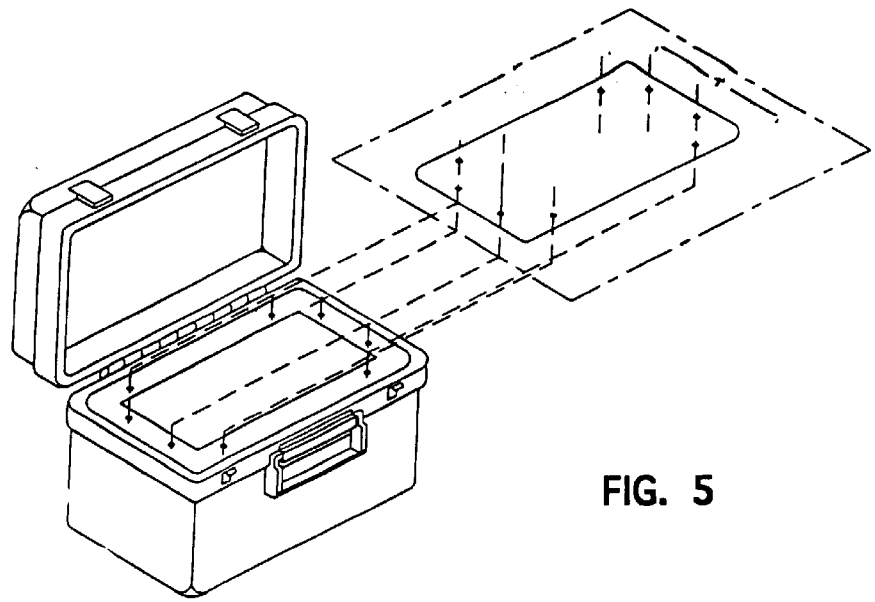
FIG. 5 is a drawing of the case for the above embodiment.

FIG. 5 is a drawing of the case for the APU tester showing it and its compact features. The complete unit weighs no more than 10 pounds.

How to Test the KC135R APU

All of the principal components of the T40LC-2 APU can be tested very conveniently with the above described embodiment of the present invention. The APU Tester is designed to operate in three modes. These modes are referred to as a "Test Mode", a "Monitor Mode"; and a "Breakout Box Mode". Each of these modes of testing is described below:

Test Mode

In the Test Mode the APU Tester will electrically command and operate LRU components while the turbines are inactive. In this mode, circuits are tested individually. The APU Tester is connected to the T40LC-2 APU as shown in FIG. 6B using the cable provided with the APU Tester. In the test mode, as indicated at 110 on FIG. 4A, the contacts on switch S1 are in the down position. The following LRU's can be tested in this mode:

|  | SWITCH | |
| --- | --- | --- |
|  | FIG. 4D | FIG. 2 |
| Starter Motor Hydraulic Valve | (DS-4) | SM |
| Exciter & Fuel Valve | (DS-5) | EFV |
| Main Fuel Valve | (DS-6) | MFV |
| Fuel Control Servo | (DS-7) | FCS |
| IGV Servo | (DS-8) | IGV |
| Surge Bypass Servo | (DS-9) | SBS |
| Fuel Purge Valve | (DS-10) | FPV |

As each of the seven LRU's is tested by pushing the LRU two pole double throw test button as shown on FIG. 2 corresponding to the LRU being tested as shown on FIG. 4D, the APU Tester will send a low voltage short pulse to the selected LRU. For example LRU Test Button DS-4 corresponds to the Start Motor Valve, DS-5 is the Exciter & Fuel Valve. These are indicated in the above table. In the case of the Starter Motor Hydraulic Valve, Exciter and Fuel valve, Main Valve, and the Fuel Purge Valve; the voltage is 28 volts DC. For the Fuel Control Servo, the IGV Servo, and the Surge Bypass Servo; the voltage pulse is 10 volts DC. This is accomplished as shown in FIGS. 4C and 4D. The 28 volts is produced by a 28 Volt pulse generator 102 as shown on FIG. 4C. The pulse path follows a line indicated by on and off page designator 71 as shown on FIG. 4C and correspondingly on FIG. 4D. The signal daisy chains through the four switches as indicated at the top of FIG. 4D to designator 55 then through voltage limiter 104 as shown on FIG. 4C to provide a reduced voltage pulse of 10 volts for the three switches as shown at the bottom of FIG. 4D. The duration of the voltage pulse is 50 milliseconds unless the LRU is detected as shorted, in which case the pulse duration will be reduced to 20 milliseconds. The 28 VDC pulse is limited to 1.2 amps maximum, and the 10 VDC pulse is limited to 0.6 amps maximum.

In this test mode the APU Tester switches are set as follows with the switch numbers indicated in parenthesis and designated on FIGS. 2 and 4A:

| SWITCH | | SETTING |
| --- | --- | --- |
| LRU TEST/MONITOR MODE | (S1) | LRU TEST |
| EWO ON/APU STOP | (S11) | OFF |
| GEN ONLY/FIRE STOP | (S12) | OFF |

With the APU off all indicators on the APU tester are off. When the APU is switched on, 28 volts DC from the APU supply battery enters the APU Tester through pins 1 and 2 as shown at 106 in FIG. 4A of I/O Connector 105. The I/O connector is shown at upper right corner of FIG. 2. The signals corresponding to numbered pins of the connector are shown on FIG. 4A. The 28 volts DC turns on the Power On indicator 108 and is routed to the Test Power Indicator 116 (see FIG. 4B) via switch S1. Since switch S1 is in the "down" position, the signal is routed from pins 5 and 8 to pins 6 and 9 and, as indicated by page designator 2 on FIG. 4A and on FIG. 4B, through signal buffers 112 and the lighted indicator interface 114 (also shown in FIG. 4B) to DS 19. In this mode the 28 volt DC signal is prevented from reaching the I/O connector 105 pins 3 and 4 by the position of S1 as shown in FIG. 4A. This prevents the 28 Volts from reaching the ESCU to activate start sequence and allows the LRU's to be tested with the APU turbine inactive.

At this point any of the LRU's can be tested. Power to 28 Volt pulse generator is provided via I/O connector pins 1 and 2 through switch S1 via as shown by following page designator 2 (FIGS. 4A and 4C). For example, to test the Starter Motor Hydraulic Valve, switch DS4 (as shown in FIG. 4D and at 118 on FIG. 2) is depressed. This routes the relay test pulse at push button switch DS4 out to the Starter Motor Hydraulic Valve. The path the test pulse follows begins at the pulse generator 102 shown in FIG. 4C. Following designator 71 (FIGS. 4C and 4D) the pulse continues through switch DS4, which is in the "down" position, to designator 10 (FIGS. 4D and 4A) and out to Starter Motor Valve via I/O connector 105 as shown as "Starter Motor Valve Out" on FIG. 4A. Before any of the LRU test switches are depressed the test signal is daisy-chained through all switches (DS4–DS10) as shown in FIG. 4D and into the test control circuitry 120 as shown on FIG. 4B via the signal buffer 112 as shown by following designators 55 and 56 on FIGS. 4D and 4B. When any LRU test switch is depressed the test control circuitry senses the removal of the test signal, activates the pulse enable signal, and starts an internal timer built inside the test control circuitry. Following the path from FIG. 4B to FIG. 4C through designator 70, a test pulse is generated by the pulse generator 102 when the pulse enable signal is activated. The test pulse current drawn by Starter Motor Hydraulic Valve is measured by amplifier AMP 1as shown in FIG. 4C. The amplifier outputs a signal proportional to the test pulse current to its two comparators.

If the current is less than 0.1 amps the Relay Open signal is sent to the test control circuitry 120 as indicated by page designator 58 on FIGS. 4B and 4C. If the current is greater than 1.0 amp the Relay Shorted signal is sent as indicated via designator 59 on FIGS. 4B and 4C. If the test control circuitry receives the Relay Open signal it outputs a signal to light the Fail Open Indicator DS21 as shown on FIG. 4B and as shown at 122 on FIG. 2. If the Relay Shorted signal is received, the test control circuitry outputs a signal to light the Fail Short indicator (DS20) (see FIG. 4B at 124) and immediately deactivates the Pulse Enable signal to turn off the test pulse. If the current is under 1 amp the test pulse timer in the test control circuitry will time out after 50 milliseconds and Pulse Enable signal will turn off the test pulse. The test control circuitry 120 used in this embodiment is Part No. EP910DC-40 supplied by Altera Corp. of San Jose Calif. It is an integrated circuit which was modified, in accordance with instructions available with the part, to perform the functions described above.

The Fuel Purge Valve (DS10), the Exciter & Fuel Valve (DS5), and the Main Fuel Valve (DS6) are tested using the same method as described above for the Starter Motor Hydraulic Valve.

The Fuel Control Servo (DS 7) is tested using a method similar to that described for the Starter Motor Hydraulic Valve. The main difference is that the 28 volt DC test pulse generated is reduced to 10 volts DC using the voltage limiter 104 as shown in FIG. 4C. The other difference is in the circuitry used to measure the current. The test pulse current drawn by the Fuel Control Servo is measured by amplifier AMP 2. The amplifier outputs a signal proportional to the test pulse current to its two comparators. If the current is less than 50 milliamps, the Servo Open signal is sent to the test control circuitry. If the current is greater than 200 milliamps the Servo Shorted signal is sent. If the test control circuitry receives the Servo Open signal it outputs a signal to light the Fail Open indicator. If the Servo Shorted signal is received, the test control circuitry outputs a signal to light the Fail Short indicator and immediately deactivates the Pulse Enable signal to turn off the test pulse. If the current is under 200 milliamps then the test pulse timer in the test control circuitry will time out after 50 milliseconds and the Pulse Enable signal will turn off the test pulse. The IGV Servo (DS8) and the Surge Bypass Servo (DS9) are tested using an identical method as the Fuel Control Servo.

Oscilloscope Readings

The Test Mode also allows the APU Tester to obtain oscilloscope readings of test signals for the following LRU's:

Start Motor Hydraulic Valve

Fuel Purge Valve

Exciter & Fuel Valve

Main Fuel Valve

Fuel Control Servo

IGV Servo

Surge Bypass Servo

LRU Relay Test Pulse

LRU Servo Test Pulse

Switch S2 (FIG. 4E) is used to select the signal to be observed. The signals on deck 1 of S2 (S2-1) are measured from test jack J1 red 126 as shown on FIG. 2 to ground. The signals between S2-3-1 and S2-3-12 as shown at 129 on FIG. 4E are measured from test jack J2 red 128, as shown on FIG. 2, to J2 black 131. The signals between S2-3-13 and S2-3-20 are measured from test jack J2 red 128 to ground.

MONITOR MODE

The Monitor Mode of the APU Tester (switch S1 in "up" position as shown at 111 on FIG. 4A) provides lighted indicators to visually display when the ESCU signals are being applied to, or received from the various LRU's and remote sensors. In addition, a test selector switch permits the connection of external test instruments to any of the ESCU input or output signals during test.

While in the Monitor Mode two display storage modes are available. Each storage mode is accessed by using the Test Point Selector Switch, FIG. 4E and also shown at 130 on FIG. 2. In position 21, signals from the component listed in the table below will be stored (i.e., the light located on the front panel as shown in FIG. 2 corresponding to the component [and indicated by the initials of the respective component] will turn on and remain on until the reset button is pushed) any time they become active. In position 22 the signal will be stored only after the Power Latch signal has been issued by the ESCU. In all other positions of the Test Point Selector Switch no signal storage will occur. In the storage modes, only the following signals are stored:

| Start Motor Valve | Start ESCU | Oil Pressure | Fuel Control Servo |
|---|---|---|---|
| Surge Bypass Servo | Fire Stop | Oil Temp. | IGV Servo |
| Exciter & Fuel Valve | APU Stop | Hour Meter | Fuel Purge Valve |
| Main Fuel Valve | Generator Only | Ready Load | Power Latch Output |

The purpose of the signal storage feature is to allow fault isolation if shutdown occurs during the APU start up sequence. In the Display Store Mode (position 21) the APU Tester will latch all signals and therefore display all signals issued by the ESCU before shutdown. As a normal part of its testing function, the ESCU regularly issues LRU signals before the APU start sequence to insure the proper resistance of the electric circuits of the LRU equipment. The Store After Power Latch Mode (position 22) will allow storage of all signals issued after the Power Latch signal and before shutdown. The purpose of this mode is to eliminate the latching of the LRU test signals issued before the actual APU startup sequence.

The following additional lighted indicators are also provided on the front panel as shown in FIG. 2 by their respective abbreviations in Monitor Mode:

| EWO Signal | Power On | Low Battery |
|---|---|---|
| EWO Hour Meter Signal | Test Power | |
| Engine Speed | Run Mode | |

The EWO and EWO Hour Meter signals display the operating condition of these ESCU inputs and outputs. The engine speed indicator is provided to display the engine speed with a flashing rate that is proportional to the speed. The Power On indicator is on any time +28 VDC is applied. Test Power indicates the LRU Test Mode, and Run Mode indicates the Monitor Mode. The Low Battery indicator will turn ON and latch whenever the APU battery voltage drops below 16.5 VDC. A reset switch is provided to reset the low voltage indicator.

For operation in the Monitor Mode, the APU Tester is connected between the ESCU and the turbine assembly's LRU's and remote sensors as shown in FIG. 6B. The APU Tester switches are set as follows:

| LRU TEST/MONITOR MODE SWITCH | (S1) | MONITOR MODE |
|---|---|---|
| EWO ON/APU STOP SWITCH | (S11) | OFF |
| GEN ONLY/FIRE STOP SWITCH | (S12) | OFF |

With the APU off, all indicators on the APU Tester are off. When the APU is started, 28 Volts DC enters the APU Tester through the test connector pins 1 and 2 as shown at 106 in FIG. 4A. The 28 Volt DC turns on the Power On indicator 108 and the Run Mode indicator (DS22) as shown in FIG. 4B via S1 pins 4 and 7, the signal buffers 112, and the lighted indicator interface 114 (as shown in FIG. 4B). The 28 Volt DC signal is also routed through S1 and back out the I/O connector 105 through pins 3 and 4 as shown at 132 on FIG. 4A. This allows the APU start sequence to continue normally. At this point all signals between the ESCU and the various LRU's and remote sensors will cause a light indicator on the front panel (FIG. 2) to become illuminated whenever that signal becomes active. The 16 latchable signals listed above are reduced to a level of 5 Volts DC using the signal buffer circuits at 112 in FIG. 4B. The inputs represented by the lines on the left side of signal buffer 112 vary from 0 to 28 Volts. Circuitry provided in signal buffer 112 reduce the signal proportionally to 0 to 5 Volts represented by the lines on the right side of signal buffer 112. The corresponding outputs of the signal latch control circuitry 134 drive the lighted indicator buffers 114. The Engine Speed signal is the only repetitive signal and is buffered as shown at A in FIG. 4B. This 0–4000 HZ signal is then divided down by using a frequency divider (Part # LS 393 to ) to 0–250 Hz and further conditioned by test control circuitry to provide an output of 0 to 10 pulses per second to indicator DS 14. The two remaining APU signals, EWO On and EWO Hour Meter, connect to indicators DS17 and DS25 after being buffered by signal buffers.

While in the Monitor Mode the APU Tester can also latch any of the 16 latchable signals listed above. There are two methods of accomplishing this latching. In the Display Store Mode, S2 is placed in position 21 as shown at 136 on FIG. 4E providing a ground signal through S2-2-21 to (follow page designator 52) the signal latch control circuitry (as shown in FIG. 4B). This circuitry will then latch any of the 16 above listed signals as they become active. In the Store After Latch Mode, S2 is placed in position 22 as shown at 136 in FIG. 4E providing a ground signal through S2-2-22 to (follow designator 51) the signal latch control circuitry 134 on FIG. 4B. This circuitry will then latch any of the 16 above listed signals only after the Power Latch signal has been issued. In either case the indicators can be turned off by pushing the RESET switch (DS3) 138 on FIG. 2 and as shown in FIG. 4D. The reset button also houses the low battery indicator referred to above. This signal latch control circuitry 134, like the test control circuitry 120 discussed above, consists of an Altera Corp Part No. EP910DC-40 chip modified in accordance with instructions provided with the chip to perform the functions described above.

The APU battery is automatically and continuously monitored by the low voltage detector circuitry as shown at 140 in FIG. 4B. If the battery voltage drops below 16.5 Volts DC, the comparator outputs a signal that is latched by the test control circuitry and sent to the Low Voltage indicator (DS3) as indicated in FIG. 4D (by following page designator 69). This indicator is also turned off by pushing the RESET switch.

Oscilloscope Testing in Monitor Mode

The APU Tester permits oscilloscope testing in the Monitor Mode. The following signals can be monitored:

Starter Motor Hydraulic Valve
Fuel Purge Valve
Exciter & Fuel Valve
Main Fuel Valve
Fuel Control Servo
IGV Servo
Surge Bypass Servo
Power Latch
Hour Meter
EWO Meter
Ready Load
Start ESCU
Fire Stop
APU Stop
EWO On
Generator Only
Oil Pressure
Oil Temperature
Engine Speed
EG Temp 1
EG Temp 2
LC Input Temp
Temp Meter
Speed Meter
LC Exit Temp
Bite
Bite Reset 1
CMD Bit 1 through 6

Switch S2 (FIG. 4E) is used to select the signal to be measured. The signals on deck 1 of S2 (S2-1) are measured from test jack J1 red to ground. The signals between S2-3-13 and S2-3-20 are measured from test jack J2 red to return or ground. The signals between S2-3-1 and S2-3-12 are measured from test jack J2 red to J2 black.

BREAKOUT BOX MODE

In the Breakout Box Mode the APU Tester is used to connect an ohmmeter via test jacks to any of the control function lines, signal lines, or sense lines in order to measure the resistance of APU circuitry. The resistance of any of the 33 APU circuits listed in the above section of this specification can be measured.

For operation in the Breakout Box mode the APU Tester is connected as described above for the Monitor Mode. The APU Test switches are set as follows:

| SWITCH | | SETTING |
|---|---|---|
| LRU TEST/MONITOR MODE | (S1) | CENTER POSITION |
| EWO ON/APU STOP | (S11) | OFF |
| GEN ONLY/FIRE STOP | (S12) | OFF |

Since the APU must remain off in this mode, all indicators on the APU Tester will be off. Switch S2 (FIG. 4E) 130 on FIG. 2 is used to select the circuit to be measured. The signals on deck 1 of S2 (S2-1) are measured from test jack J1 red to ground. The signals between S2-3-13 and S2-3-12 are measured from test jack J2 red to J2 black. The signals between S2-3-13 and S2-3-20 are measured from test jack J2 red to ground.

Other Switch Functions

The remaining functions of the EWO ON/APU STOP switch and the GEN ONLY/FIRE STOP switch are duplicate APU functions provided for the convenience of the operator. These two momentary toggle switches, S11 and S12 as shown on FIG. 4A and FIG. 2 provide an alternate means to generate the EWO ON, APU STOP, GEN ONLY and FIRE STOP signals that are normally activated using the APU control panel.

Other Applications

Figure 8:
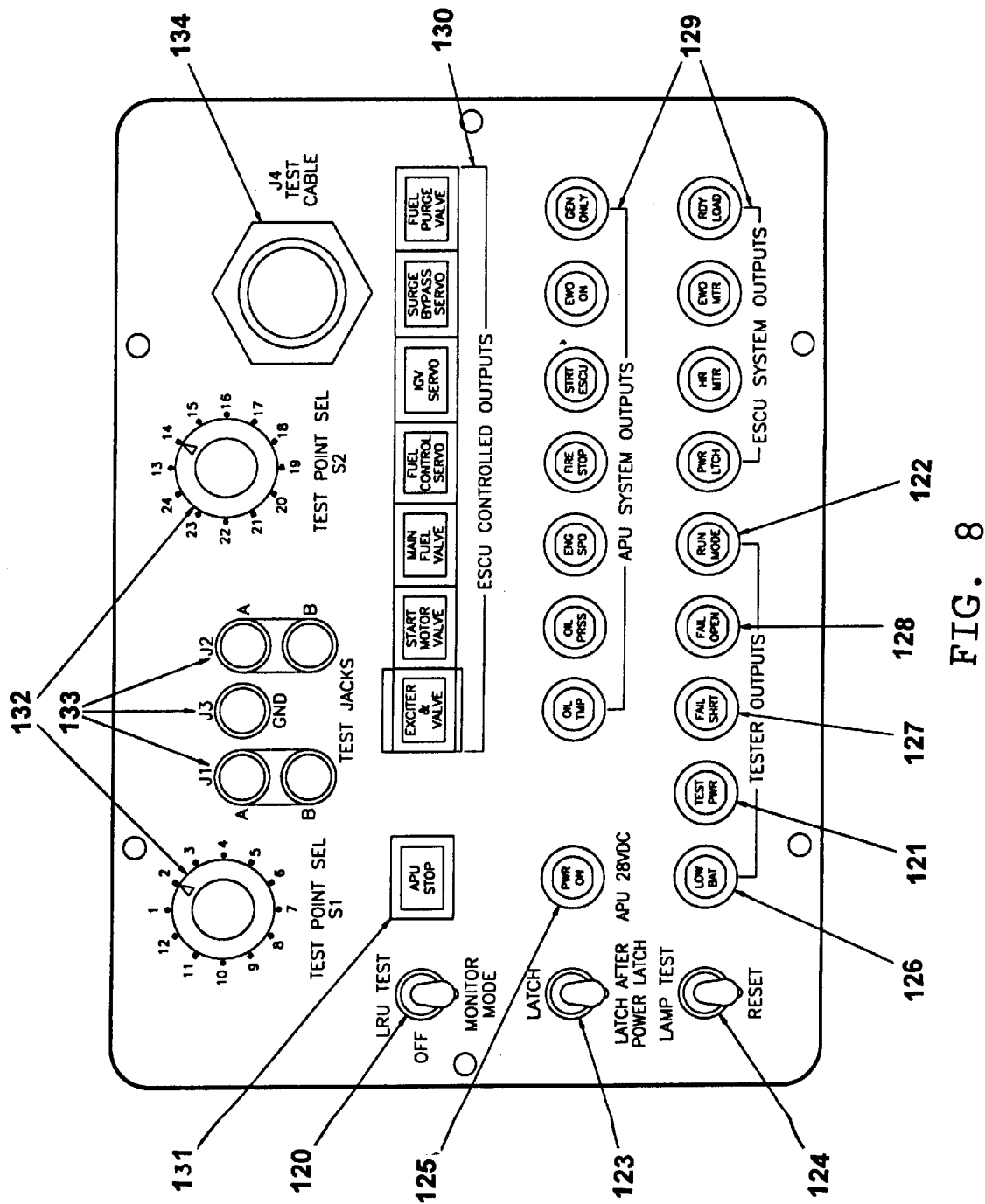
FIG. 8 is a front panel layout of first embodiment of the present invention.

In FIGS. 7–14, we describe a second preferred embodiment. FIG. 8 is a front panel layout of the first embodiment of the APU Tester showing its principal elements. These elements include a mode select switch 120 with visual indication 121 and 122 of the selected mode, a signal latch control switch 123, a lamp test and reset switch 124, a power on indicator 125, a low battery indicator 126, fault indicators 127 and 128 for failures during the LRU Test mode, multiple indicators 129 for monitoring various APU signals, LRU test switches with built-in indicators 130, an APU Stop switch with built-in indicator 131, select switches 132 to route any APU signal to test jacks 133 for measurement using external test equipment, and an I/O connector 134 to connect the APU Tester cable (116 of FIG. 10).

The APU Tester provides the means to operationally monitor and test the electrical signals between the ECU and each LRU. It permits a ready means of performing the initial fault isolation of any LRU of a failed APU. While the APU Tester performs its testing of the APU by examining and exercising electrical signals, this method will uncover problems of both an electrical and an electromechanical nature. This is due to the fact that the electrical signals monitored are often the outputs of sensors that are reporting the operating conditions of mechanical parts. In addition, the relay and servo signals that are exercised will indicate both electrical and electromechanical failures. This level of testing is adequate since the vast majority of APU failures are electrical or electromechanical in nature. When a defect in an LRU is identified, the defect can be repaired if the problem is obvious; or the LRU can be quickly replaced and repaired later; or, if repair is not appropriate, disposed of. Problems with the ECU can also be identified and when this is the case, the ECU can also be quickly replaced to minimize down time of the vehicle.

Figure 9:
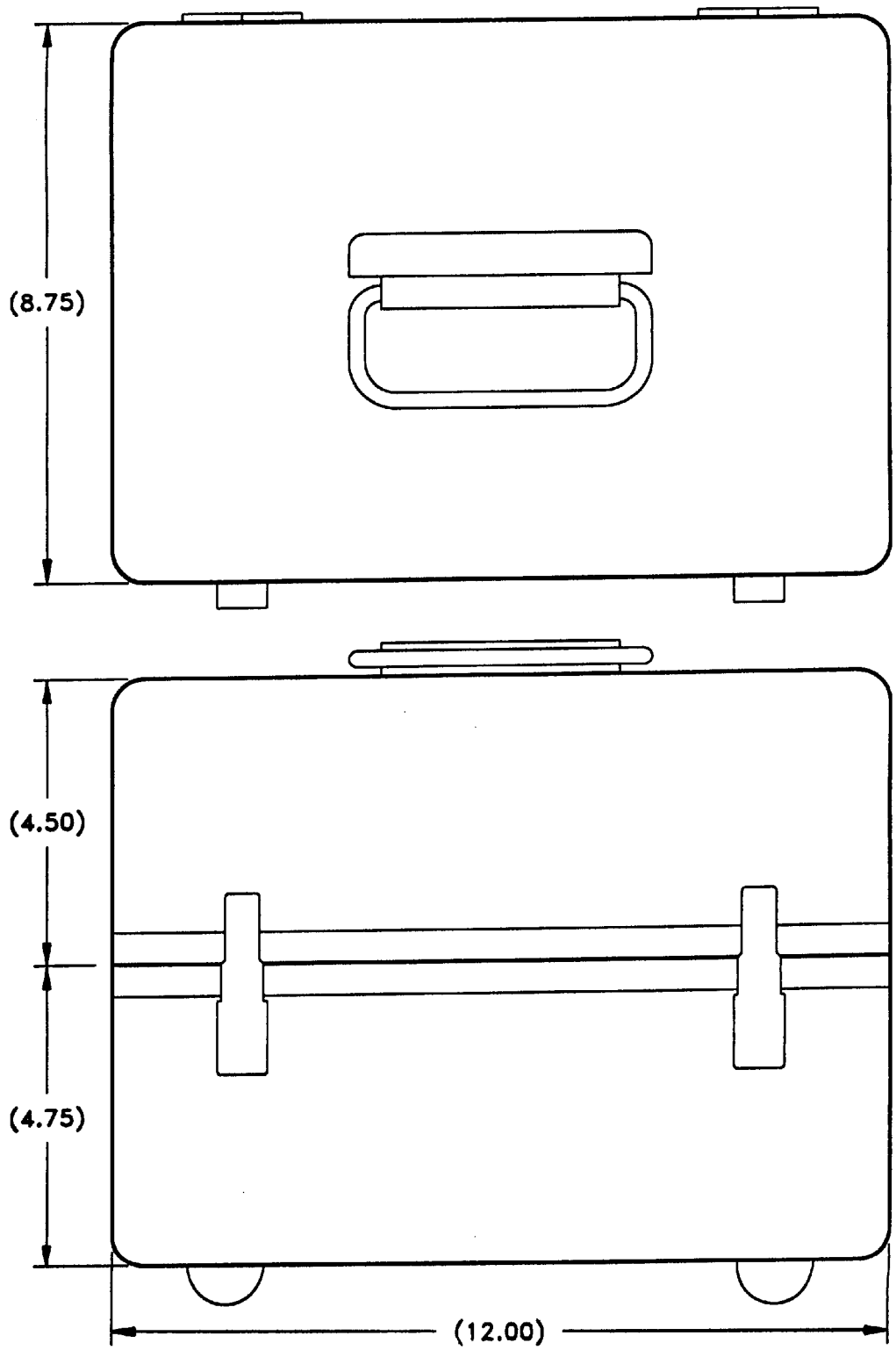
FIG. 9 is a drawing of the case for both embodiments.

FIG. 9 is a drawing of the case for the APU Tester showing it and its compact features. The case is identical for each of the preferred embodiments. The complete unit weighs no more than 14 pounds.

Figure 10:
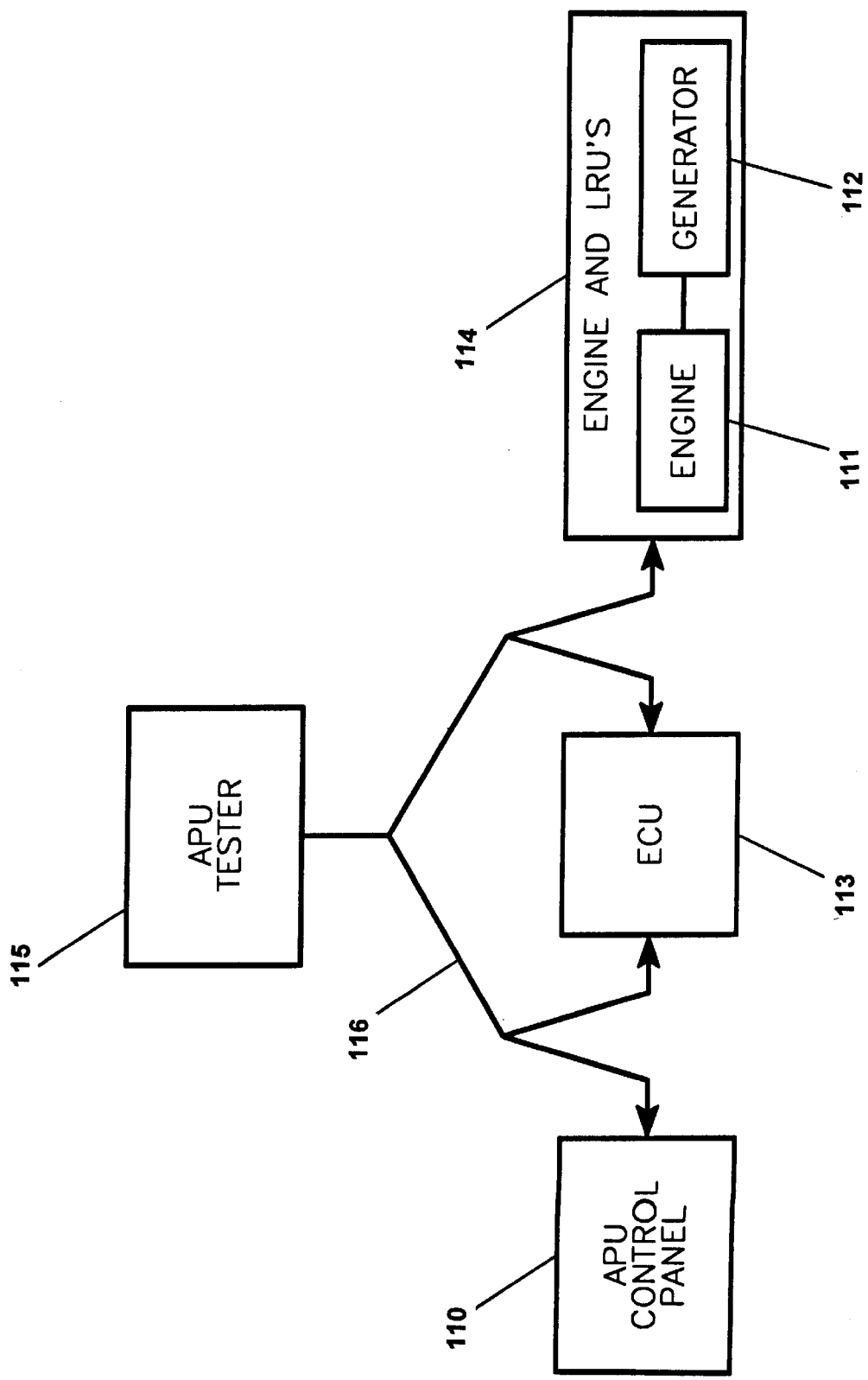
FIG. 10 is a wiring diagram showing the interconnections when using the first embodiment to test APUs.

The first embodiment of the APU Tester is shown in FIG. 10 connected to a KC-135R APU system. APU Tester cable 16 permits the APU Tester to be electrically inserted in between (1) the operator control panel 110 and the ECU 113 and (2) the ECU and the engine compartment LRUs 114. The connectors of the APU Tester cable are the equivalent mates to the APU connectors so the connections can be made quickly and easily. The other end of APU Tester cable connects to the I/O connector (134 of FIG. 8) located on the APU Tester front panel.

Figure 11:
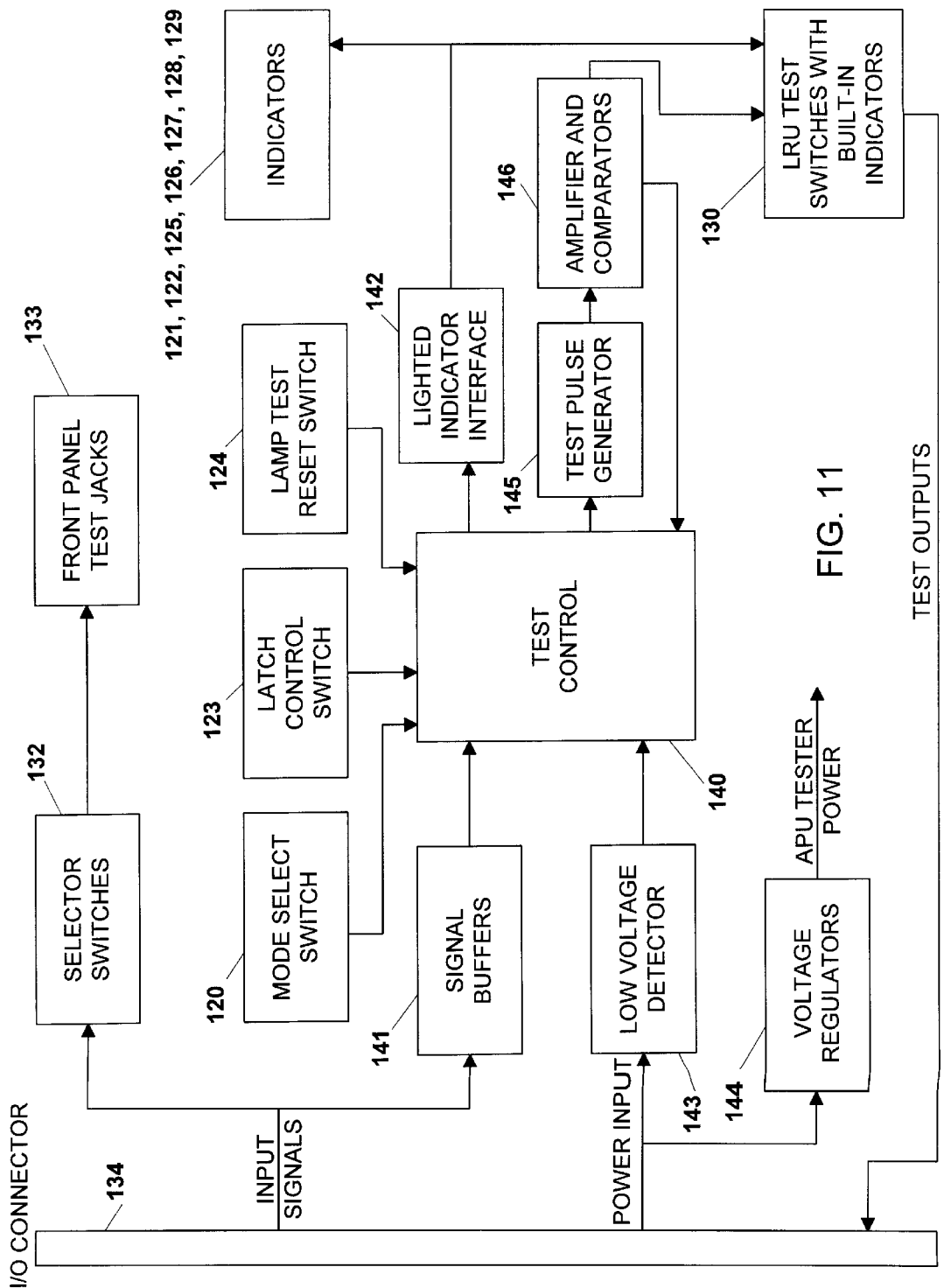
FIG. 11 is a block diagram applicable to both embodiments.
Figure 12:
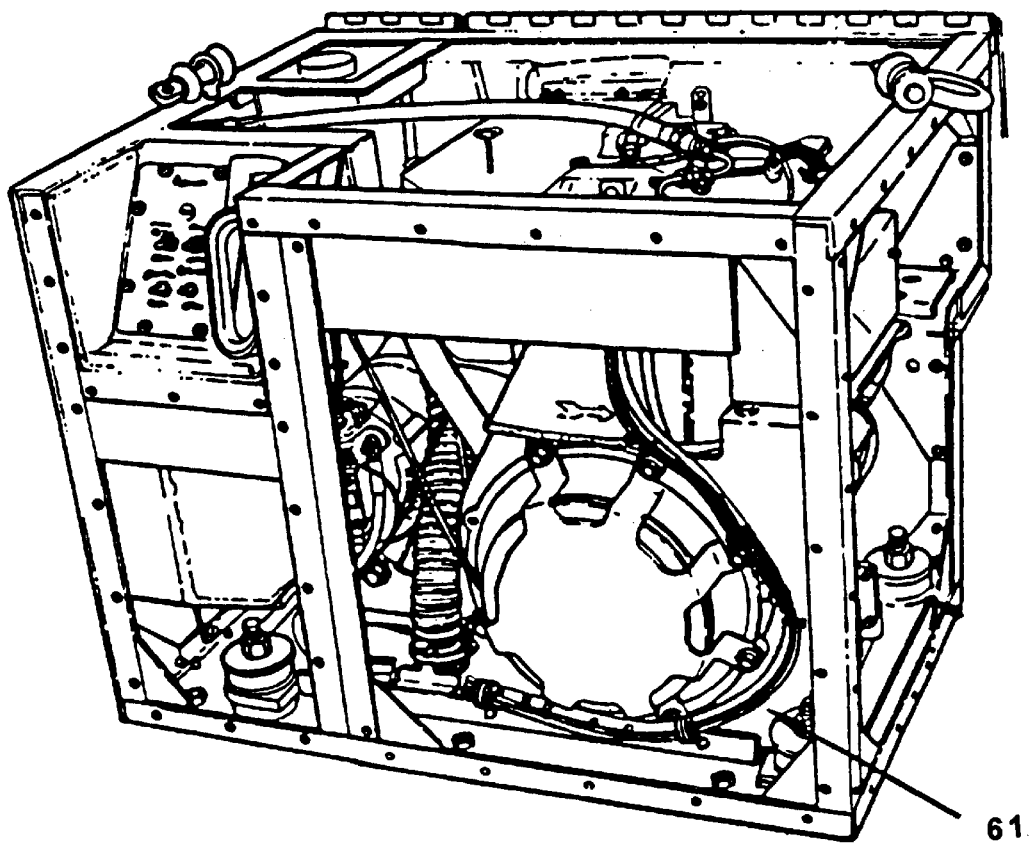
FIG. 12 is a drawing of ABRAMS tank APU equipment.

The electrical circuits of the APU Tester are shown in FIG. 11. This figure applies to both embodiments since the functions of the circuits are the same for each embodiment. The principal electronic components of the APU Tester are:

(1) Test control circuit 140 which controls all APU Tester monitor and test functions. This circuit is supplied by Actel Corp. of San Jose, Calif. as Part No. A1010B-PG84C.

(2) Signal buffers 141 which transform the high voltage (typically 24 to 28 volts) inputs to the 5 volts required by the test control circuit.

(3) Lighted indicator interface 142, supplied by Texas Instruments as Part No. ULN2003AN.

(4) Front panel indicators 121, 122, 125, 126, 127, 128, and 129 which provide visual indication of the signal state and fault conditions.

(5) Low battery voltage detector circuit 143 to monitor battery power.

(6) Voltage regulators 144, to provide APU Tester power.

(7) Voltage test pulse generator 145 which consists of a voltage regulator controlled by the test control circuit.

(8) Amplifier and comparator circuit 146 which monitors the current during LRU testing.

(9) LRU test buttons with built-in indicators 130 activate an individual LRU test.

(10) Mode select, latch control, reset, and lamp test switches 120, 123, and 124, control the APU Tester functional state.

(11) Dual two pole, 112 position selector switches 132, to route APU signals to the

(12) Test jacks 133 to permit oscilloscope and other monitoring of APU signals.

How to Test the KC-135R APU

All of the principal components of the APU can be tested very conveniently with the above described embodiment of the invention. The APU Tester is designed to operate in three modes. These modes are referred to as the "LRU Test Mode", the Monitor Mode", and the "Breakout Box Mode". Each of the modes of testing is described below.

LRU Test Mode

In the LRU Test Mode the APU Tester will electrically command and operate LRU components of the APU while the engine is inactive. In this mode LRU circuits are tested individually. The APU Tester connects to the APU as shown in FIG. 10 using the cable 116 provided with the APU Tester. To enter the LRU Test Mode, the mode select switch 120 shown in FIG. 8 and FIG. 11 is moved to the LRU TEST position. When the APU is off all indicators on the APU Tester are off. When the APU is switched on, DC voltage from the APU supply battery enters the APU Tester through I/O connector 134 and turns on the Power On 125 and the Test Power 121 indicators. The DC voltage is stopped from continuing back to the I/O connector by the position of the mode select switch. This prevents the DC voltage from reaching the ECU to activate the normal APU start sequence and allows the LRUs to be tested with the APU engine inactive.

At this point any of the APU's LRUS can be tested. As each LRU is tested by pushing a corresponding LRU test button 130, the APU Tester will send a short voltage pulse to the selected LRU. The test control circuit 140 of FIG. 11 senses that a LRU test button has been depressed and causes the test pulse generator 145 to output the voltage pulse. The pulse daisy chains through the LRU test buttons 130 until reaching the depressed button. Here it is routed as an output via the I/O connector to the LRU selected for test. The current being drawn by the LRU under test is measured by amplifier 146. The amplifier outputs a signal proportional to the test pulse current to four comparators (also 146). The outputs of the comparators are monitored by the test control circuit. If the current is much less than expected or zero the test control circuit causes the FAIL OPEN indicator 128 to light. If the current is much greater than expected the test control circuit causes the FAIL SHORT indicator 127 to light and immediately deactivates the test pulse generator. Normally the test control circuitry will time out after 50 milliseconds and then deactivate the test pulse generator. All LRUs are tested in a similar manner. Depending on which LRU is selected for test, the test control circuitry will cause the test pulse generator to adjust the test voltage pulse to a level appropriate for that LRU.

The APU supply battery is automatically and continuously monitored by the low voltage detector circuitry 143. If the battery voltage drops below an acceptable limit, the comparator outputs a signal is latched by the test control circuitry and sent to the LOW BAT indicator 126. This indicator will remain on even after the battery voltage returns to normal until the LAMP TEST/RESET switch 124 is momentarily moved to the RESET position.

While in the LRU Test Mode, the APU Tester will also allow the measurement of any APU signal present at the I/O connector using an oscilloscope or other test equipment. The two signal selector switches 132 are used to select up to four signals for observation (one signal via each pole of each switch). The signals selected are routed to the test jacks 133 to facilitate the connection of external test equipment.

Monitor Mode

The Monitor Mode of the APU Tester provides lighted indicators to visually display when the APU system's signals are active. The APU Tester connects to the APU as shown in FIG. 10 using the cable 116 provided with the APU Tester. To enter the Monitor Mode, the mode select switch 120 shown in FIG. 8 and FIG. 11 is moved to the MONITOR MODE position. When the APU is off all indicators on the APU Tester are off. When the APU is switched on, DC voltage from the APU supply battery enters the APU Tester through I/O connector 134 and turns on the Power On 125 and the Run Mode 122 indicators. The DC voltage is also routed through the mode select switch and back out the I/O connector. This allows DC voltage to reach the ECU and the ECU to continue the normal APU start sequence.

At this point all APU signals to be monitored will cause a corresponding indicator on the APU Tester front panel (FIG. 8) to light whenever that signal becomes active. All signals to be monitored have their voltage levels reduced to a 5 volt DC level by the signal buffer circuitry 141 in FIG. 11. The signal input level from a typical APU system will vary from 0 to 24 (or 28) volts. The circuitry of the signal buffers proportionally reduce these input levels to 0 to 5 volts. The corresponding outputs of the test control circuitry 140 drive the lighted indicator interface 142 which in turn drive the lighted indicators 121, 122, 125, 126, 127, 128, 129, and 130. Typically a signal related to the APU engine speed is present and is the only repetitive signal that is monitored. Instead of directly driving an indicator, the test control circuitry scales this signal and provides an output of 0 to 10 pulses per second (proportional to current engine speed) to an indicator.

While in the Monitor Mode, the APU Tester can latch the signals (provide display storage) which drive the lighted indicators. This means that when a signal becomes active and its corresponding indicator is illuminated, the indicator will remain lit even after the signal goes inactive. Normally an indicator will go out when its corresponding signal goes inactive. The latch feature provides a record that a signal did become active in the event that a user conducting a test has his attention focused elsewhere. To activate this capability the signal latch control switch 123 is moved to the LATCH position. The test control circuitry 140 detects this and holds all outputs to the lighted indicator interface 142 active as the corresponding inputs become active. These outputs remain active, even after the corresponding inputs go inactive, until the signal latch control switch is moved to the OFF position or the LAMP TEST/RESET switch 124 is momentarily moved to the RESET position.

The two signal selector switches 132, the test jacks 133, and the low voltage detector circuitry also work in the Monitor Mode in a method identical to that which is described in the LRU Test Mode.

Breakout Box Mode

In the Breakout Box Mode the APU Tester is used to connect an ohmmeter via the front panel test jacks to any of the APU system signal lines in order to measure the resistance of APU circuitry. For operation in the Breakout Box Mode the APU Tester is connected to the APU as shown in FIG. 10 using the cable 116 provided with the APU Tester and the mode select switch 120 shown in FIG. 8 and FIG. 11 is moved to the OFF position. Since the APU must also remain OFF in this mode, all indicators on the APU Tester will be off. The two signal selector switches 132 are used to route up to four signals (one signal via each pole of each switch) simultaneously to the test jacks 133.

Tank Applications

Figure 13:
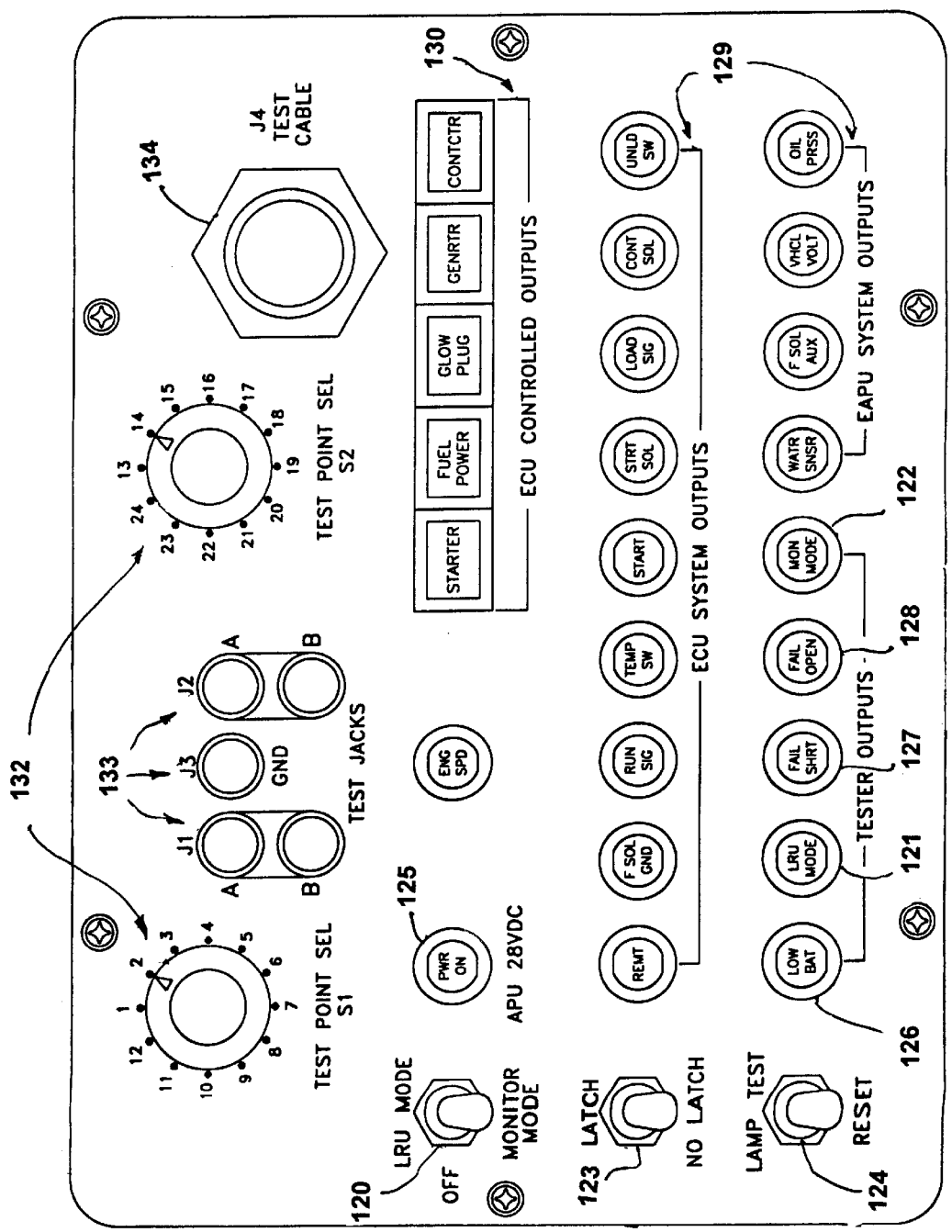
FIG. 13 is a front panel layout of second embodiment.

Due to the similarity of the two embodiments only the differences of the second embodiment as compared to the first embodiment are highlighted in this section. FIG. 13 is a front panel layout of the second embodiment of the APU Tester showing its principal elements. These elements include a mode select switch 120 with visual indication 121 and 122 of the selected mode, a signal latch control switch 123, a lamp test and reset switch 124, a power on indicator 125, a low battery indicator 126, fault indicators 127 and 128 for failures during the LRU Test mode, multiple indicators 129 for monitoring various APU signals, LRU test switches with built-in indicators 130, select switches 132 to route any APU signal to test jacks 133 for measurement using external test equipment, and an I/O connector 134 to connect the APU Tester cable (116 of FIG. 14).

Figure 14:
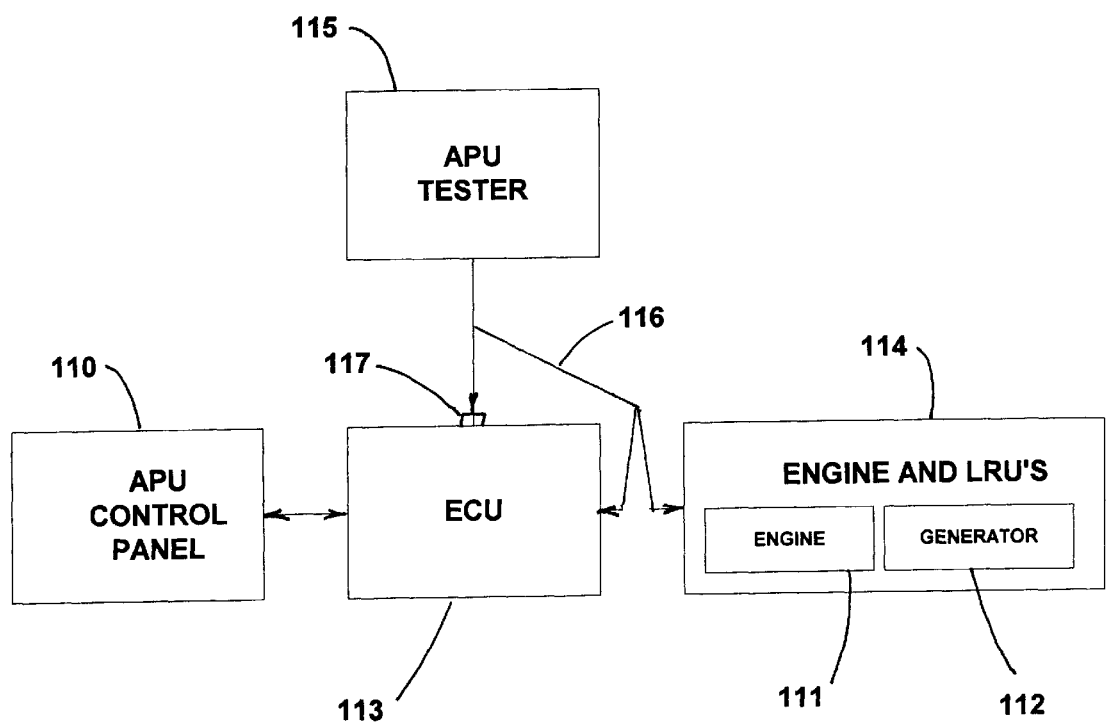
FIG. 14 is a wiring diagram showing the interconnections when using the second embodiment to test APUs.

The second embodiment of the APU Tester is shown in FIG. 14 connected to a ABRAMS Tank EAPU system. APU Tester cable 116 permits the APU Tester to be electrically inserted in between the ECU and the engine compartment LRUS 114. The cable also permits additional signals to be monitored via the ECU's test connector 117. The connectors of the APU Tester are the equivalent mates to the APU cable connectors so the connections can be made quickly and easily. The other end of APU Tester cable connects to the I/O connector (134 of FIG. 13) located on the APU Tester front panel.

The electrical circuits of the APU Tester are shown in FIG. 11. This figure applies to both embodiments since the functions of the circuits are the same for each embodiment.

While the above description contains many specificities, the reader should not construe these as limitations on the scope of the invention, but merely as exemplifications of the preferred embodiments thereof. Those skilled in the art will envision many other possible variations which are within ist scope. For example, the concepts described above can be applied by persons skilled in the art to provide testers for APU's other than those for tanks and aircraft. Accordingly, the reader is requested to determine the scope of the invention by the appended claims and by their legal equivalents, and not by the given examples.

We claim:

1. An auxiliary power unit testing device for testing auxiliary power units having an operator directed control station connected, by a first multiwire electrical cable having at least one multipin connector, to an electronic control unit, which is connected by a second multiwire electrical cable having at least one multipin connector, to at least one set of compressor and generating equipment comprising line replaceable units, said testing device comprising:

a) an auxiliary power unit testing case,
 b) an open-short circuit testing means contained in said testing case for testing for open and short circuits in LRU electrical circuits by subjecting said LRU electrical circuits with short electrical pulses and detecting resulting current flow,
 c) an electrical cabling means extending from said testing case for electrically imposing said open-short circuit testing means in between said operator directed control station and said electronic control unit and in between said electronic control unit and said line replaceable unit's, and
 d) a selector means located on said testing case for selecting electronic circuits for electrical monitoring, said selector means comprising:
 1) at least one selector switch, and
 2) at least one test jack means for connecting electrical monitoring equipment such as voltmeters and oscilloscopes, wherein the auxiliary power unit being tested is a an auxiliary power unit of a tank.

2. A testing device as in claim 1, wherein said open-short circuit testing means comprises a pulse generator and two current comparators.

3. A testing device as in claim 1, and further comprising a plurality of signal buffer circuit means and a plurality of signal latch circuit means for providing a record indicating if electrical signals are transmitted to said line replaceable units.

4. A testing device as in claim 3, wherein said record is in the form of a plurality of lights.

5. A testing device as in claim 4, wherein said plurality of lights are light emitting diodes.

6. A testing device as in claim 4, wherein said plurality of lights are incandescent lamps.

7. A testing device as in claim 1, wherein said electrical cabling means provide a connection with a battery source in said APU in order to provide power for operation of said testing device.

* * * * *